(12) United States Patent
Kunnen

(10) Patent No.: US 7,396,732 B2
(45) Date of Patent: Jul. 8, 2008

(54) FORMATION OF DEEP TRENCH AIRGAPS AND RELATED APPLICATIONS

(75) Inventor: Eddy Kunnen, Kessel-Lo (BE)

(73) Assignee: Interuniversitair Microelektronica Centrum vzw (IMEC), Leuven (BE)

( * ) Notice: Subject to any disclaimer, the term of this patent is extended or adjusted under 35 U.S.C. 154(b) by 0 days.

(21) Appl. No.: 11/048,642

(22) Filed: Jan. 31, 2005

(65) Prior Publication Data

US 2006/0131655 A1 Jun. 22, 2006

Related U.S. Application Data

(60) Provisional application No. 60/637,288, filed on Dec. 17, 2004.

(51) Int. Cl.
*H01L 21/8228* (2006.01)

(52) U.S. Cl. ............ 438/322; 438/359; 438/421; 438/422; 438/426; 257/E27.063

(58) Field of Classification Search ......... 438/404–454, 438/309–377; 257/E27.063
See application file for complete search history.

(56) References Cited

U.S. PATENT DOCUMENTS

| | | | |
|---|---|---|---|
| 4,104,086 A | 8/1978 | Bondur et al. | |
| 5,098,856 A * | 3/1992 | Beyer et al. | 438/422 |
| 5,411,913 A | 5/1995 | Bashir et al. | |
| 6,165,890 A | 12/2000 | Kohl et al. | |
| 6,180,995 B1 | 1/2001 | Hebert | |
| 6,287,979 B1 | 9/2001 | Zhou et al. | |
| 6,307,247 B1 | 10/2001 | Davies | |
| 6,448,174 B1 | 9/2002 | Ramm | |
| 6,645,832 B2 | 11/2003 | Kim et al. | |
| 6,964,907 B1 * | 11/2005 | Hopper et al. | 438/318 |
| 7,015,116 B1 * | 3/2006 | Lo et al. | 438/437 |
| 2002/0182819 A1 * | 12/2002 | Schrems et al. | 438/386 |
| 2003/0098493 A1 | 5/2003 | Marty et al. | |
| 2003/0183943 A1 | 10/2003 | Swan et al. | |

(Continued)

FOREIGN PATENT DOCUMENTS

EP 0 519 852 A 12/1992

(Continued)

OTHER PUBLICATIONS

Washio, et al., A 50-GHz Static Frequency Divider and 40-Gb/s MUX/DEMUX Using Self-Algined Selective-Epitaxial-Growth SiGe HBTs with 9-pcs ECL, IEE Transactions on Electronic devices, vol. 48, 2001.

(Continued)

*Primary Examiner*—H. Jey Tsai
(74) *Attorney, Agent, or Firm*—Knobbe Martens Olson & Bear LLP

(57) ABSTRACT

A method for forming deep trench or via airgaps in a semiconductor substrate is disclosed comprising the steps of patterning a hole in the substrate, partly fill said hole with a sacrificial material (e.g. poly-Si), depositing spacers on the sidewalls of the unfilled part of the hole (e.g. TEOS) to narrow the opening, removing through said narrowed opening the remaining part of the sacrificial material (e.g. by isotropic etching) and finally sealing the opening of the airgap by depositing a conformal layer (TEOS) above the spacers. The method of forming an airgap is demonstrated successfully for use as deep trench isolation structures in BiCMOS devices.

27 Claims, 18 Drawing Sheets

U.S. PATENT DOCUMENTS

2004/0058549 A1* 3/2004 Ho et al. .................... 438/694
2004/0147093 A1 7/2004 Marty et al.

FOREIGN PATENT DOCUMENTS

| EP | 0 519 852 A1 | 12/1992 |
| EP | 1 261 021 A | 11/2002 |
| JP | 11 243142 A | 9/1999 |
| JP | 2000 183149 A | 6/2000 |
| JP | 2001 326325 A | 11/2001 |
| WO | WO 01/26137 A | 4/2001 |

OTHER PUBLICATIONS

Patent Abstracts of Japan, vol. 1999, No. 14; JP 11 243142 A Sep. 7, 1999, (Abstract only).

Patent Abstracts of Japan, vol. 2000, No. 9; JP 2000 183149 A Jun. 30, 2000, (Abstract only).

Gutmann R. J. et al.: "Three-dimensional (3D) ICs: A technology platform for integrated systems and opportunities for new polymeric adhesives" First International IEEE Conference on Polymers and Adhesives in Microelectronics and Photonics. Incorporating Poly, Pep & Electronics. Proceedings, Oct. 21, 2001, pp. 173-180, XP002368204.

Unpublished U.S. Appl. No. 11/305,421, filed Dec. 16, 2005 to Vanhaelemeersch, et al.

European Search Report for related European Application No. 05447015.8-2203, dated Mar. 2, 2006.

* cited by examiner

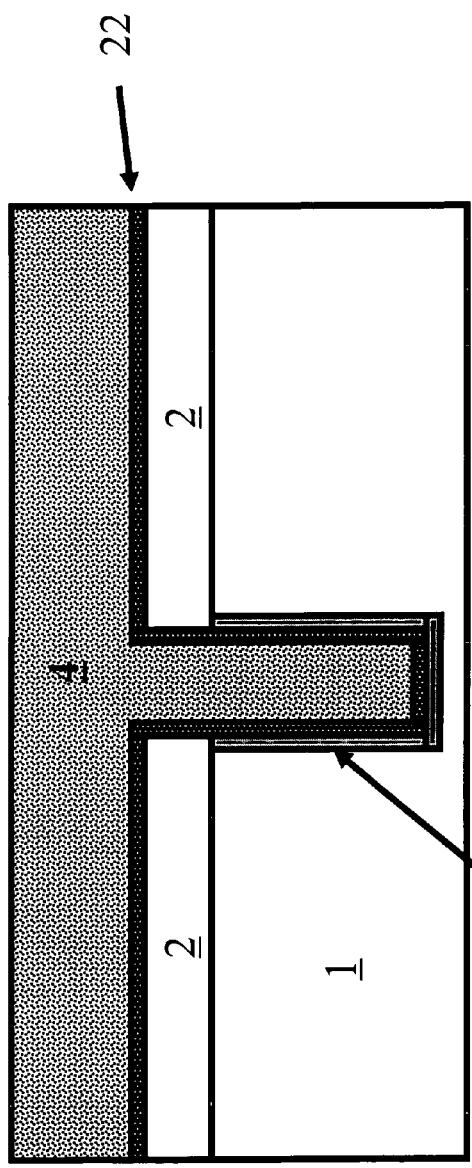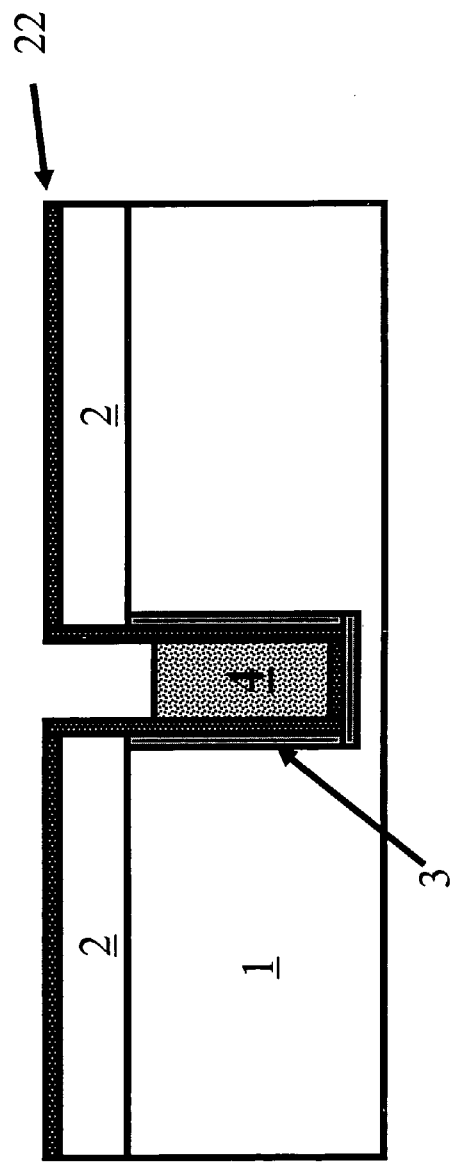
Figure 1D
Figure 1E

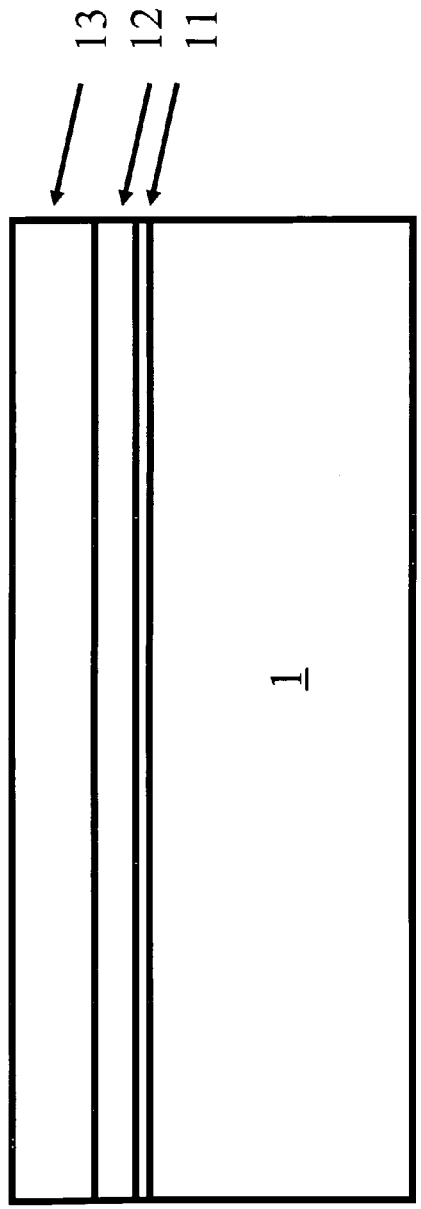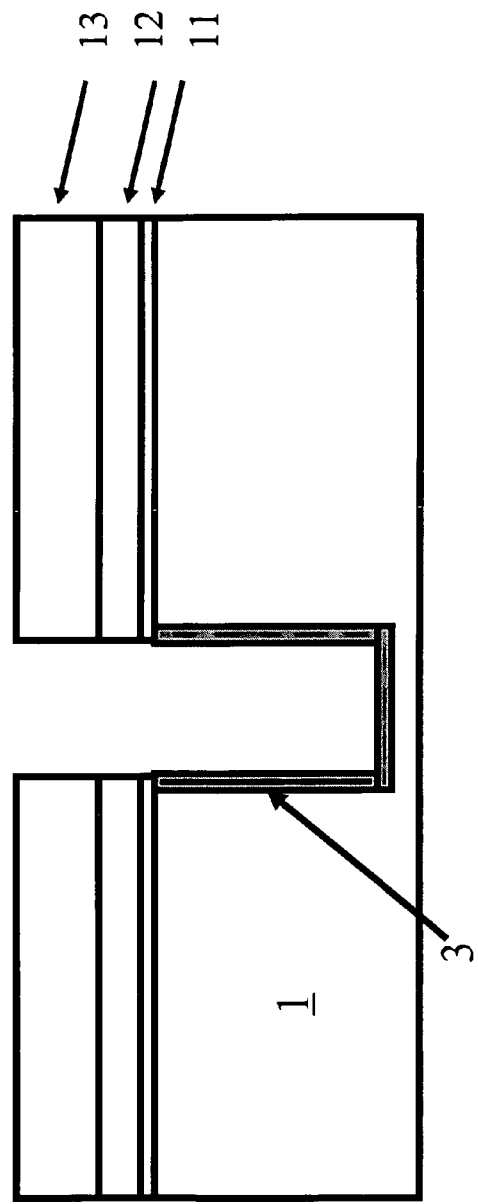
Figure 2A
Figure 2B

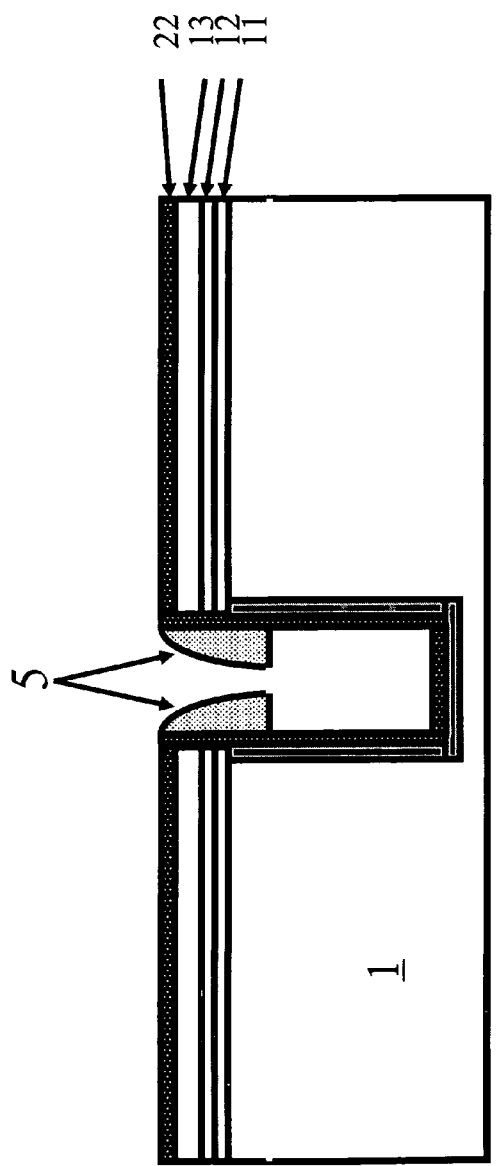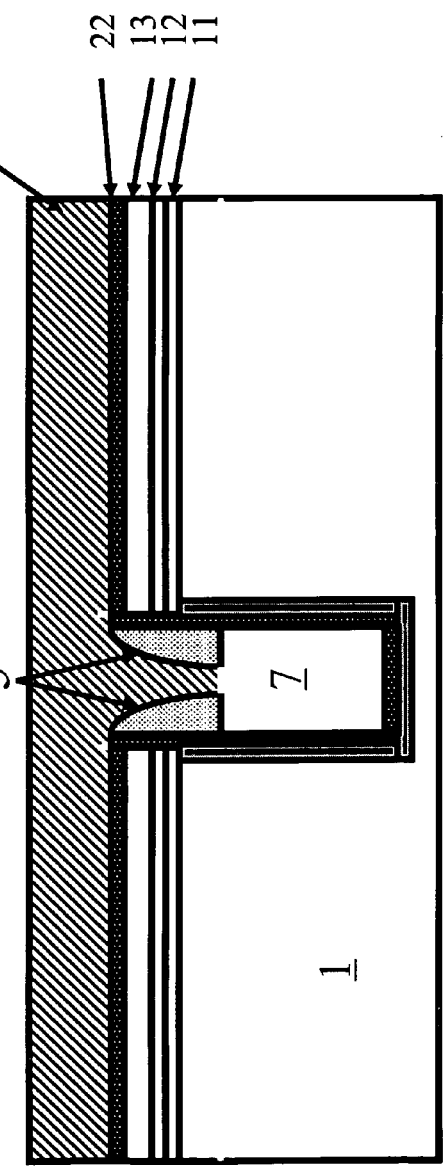

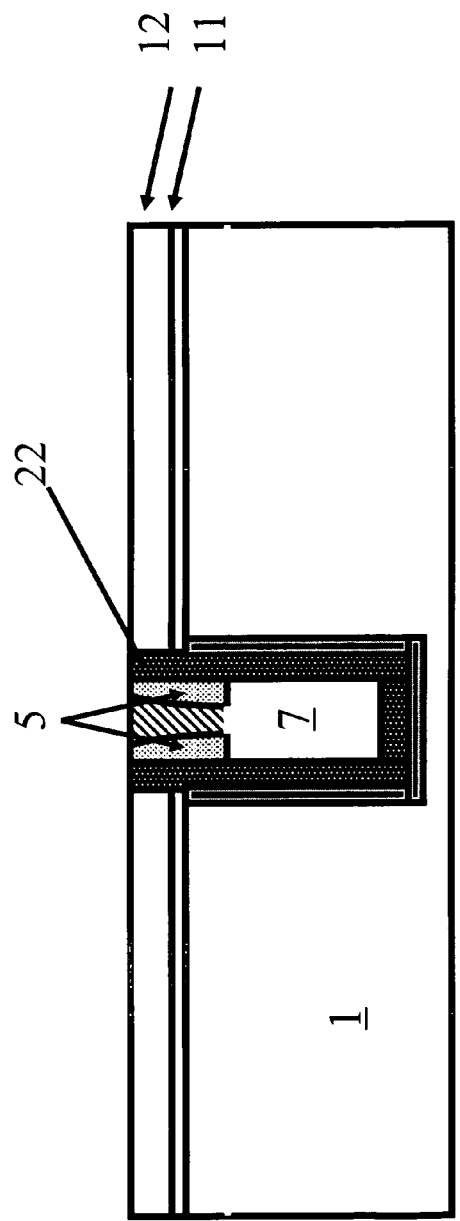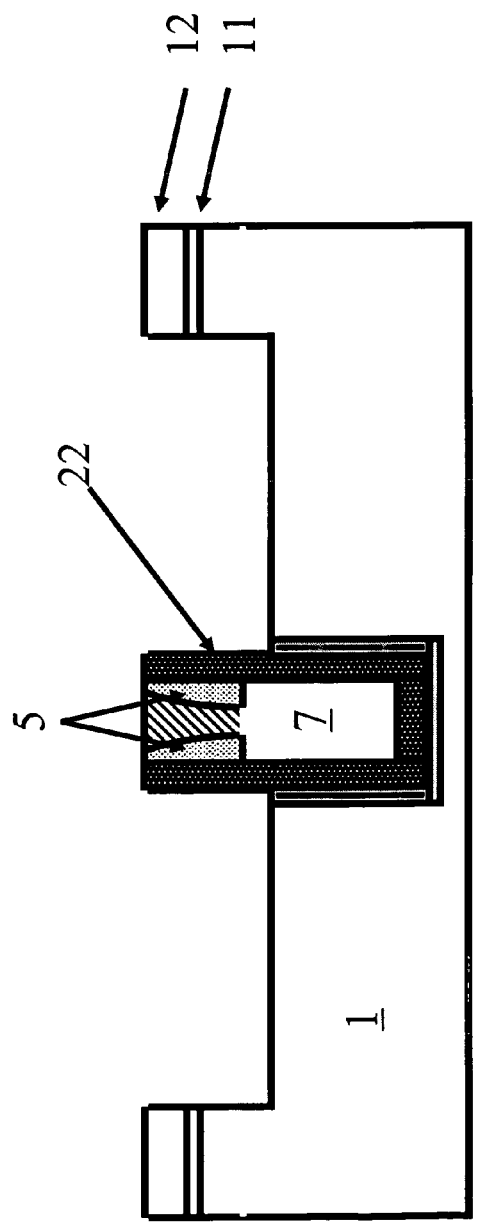
Figure 2H
Figure 2I

FORMATION OF DEEP TRENCH AIRGAPS AND RELATED APPLICATIONS

RELATED APPLICATION

This application claims the benefit of U.S. Provisional Application No. 60/637,288, filed Dec. 17, 2004, which is incorporated by reference herein in its entirety.

FIELD OF THE INVENTION

The present invention is related to the field of forming trenches or vias filled with a gas (air), also referred to as airgaps, in a semiconductor device.

BACKGROUND OF THE INVENTION

The semiconductor industry is continuously reducing the dimensions of devices. In Back End Of Line (BEOL) processing, there is an interest in reducing dimensions of conductive layers as well as in the separation of the different conductive structures from each other. Isolation of these structures therefore becomes extremely important, and low-k materials are used to replace conventional dielectric insulating materials. The trend is to move on to the incorporation of air, namely, so-called "air regions" or "airgaps", as an isolation material for conductive structures.

Examples of airgaps incorporated in BEOL structures include those based on the removal of a sacrificial material through a porous capping layer. The sacrificial material is evaporated through the porous capping layer and sealed afterwards by deposition of an extra layer. Examples of these methods are described in U.S. Pat. No. 6,165,890 and U.S. Pat. No. 6,287,979.

In Front End Of Line (FEOL) processing, isolation of the active device areas is one of the critical issues when dimensions are reduced. The device isolation methodology has been changed or modified several times with the aim of enhancing density or device finctionality. Many of the methods had certain process limitations and were not very scalable. The introduction of "trench isolation technology" has been accepted quickly by industry as the primary isolation technique for advanced device and circuit designs (see, e.g., U.S. Pat. No. 4,104,086).

For bipolar or BiCMOS technologies, device isolation is of particular importance, because the collector nodes, which are buried in the substrate, carry active signals. This is in contrast to MOS transistors, where the wells do not carry active signals. The collectors are isolated from the substrate by collector-substrate pn junctions. This junction has a box-like shape with a bottom surface determined by the transistor area and a lateral surface determined by both the transistor perimeter and the n-type region depth. It introduces a parasitic junction capacitance at the collector terminal. The value of the parasitic junction capacitance is given by the sum of a perimeter term, associated with the lateral junction, and an area term, associated with the bottom junction.

Deep trench isolation structures are employed in conventional systems, and are commonly used in advanced bipolar technologies in order to reduce the total device area and the collector to substrate parasitic capacitance. The introduction of a deep trench filled with an insulator adjacent to the bipolar transistor replaces the lateral junction with a silicon-insulator-silicon capacitor, and it can be used to reduce the value of the perimeter component of the capacitance. As the transistor dimensions are scaled down, the total value of the capacitance is also effectively reduced, because the percent weight of the perimeter component increases.

The reduction of the collector-substrate capacitance allows further optimization of the high-speed or low-power performance of bipolar transistors. In common-emitter stages designed in a low-power bipolar technology, the collector-substrate capacitance is a significant contributor to the total switching delay. A low collector-substrate capacitance value helps to produce state-of-the-art power-delay products. Other applications that can benefit from the introduction of deep trench isolation include, for example, high voltage applications that achieve high breakdown voltage. Deep trench isolation can also be employed to isolate high voltage regions from low voltage regions in applications where good latch-up immunity or low substrate noise is desired.

In a full BiCMOS technology, the deep trench has to be etched, refilled, and planarized with a CMOS compatible process module. This fact imposes constraints on the selection of the process steps and on the location of the module in the complete process flow. The trench isolation technology is based on four key process elements: trench formation; trench lining; trench filling; and trench planarization. In particular, the choice of the filling material is very important, as it determines the value of the actual capacitance of the collector substrate perimeter component. Low-κ materials are desired, with silicon dioxide being the most straightforward candidate. Although a complete oxide filling is preferred, because of its good isolation properties and low dielectric constant, this scheme is not easy to implement for several reasons. Namely, it is difficult to obtain a complete fill of the deep trench without leaving any voids, and also because a completely oxide-filled deep trench would generate localized stresses and defects during and after processing.

For these reasons, a state-of-the-art deep trench module often consists of a combined oxide/polysilicon filling. The polysilicon material makes it easier to fill the trench properly and thermal stress is reduced because the thermal expansion coefficient of polysilicon and the silicon substrate match much better. However, the isolation qualities are less (i.e., the κ-value of polysilicon is roughly a factor of 3 higher than that of oxide). For that reason, it is beneficial to increase the oxide/polysilicon ratio as much as possible, as this will reduce the final collector to substrate perimeter capacitance. One of the ways to accomplish this in a modern CMOS technology with a shallow trench isolation scheme is by the introduction of the deep trench isolation prior to the shallow trench isolation. In this way, the thickness of the oxide liner in the deep trench can be well balanced with respect to possible stress generation, thereby obtaining a low perimeter capacitance value without affecting the CMOS shallow trench isolation module itself.

Alternatively, as described by Washio et al. (IEEE Transactions on Electronic devices, Vol. 48, 2001), double deep trenches can be used, at the expense of increased device area.

SUMMARY OF THE INVENTION

A method for forming airgaps in a semiconductor substrate is disclosed comprising the steps of patterning a hole in the substrate and partly or completely fill the hole with a sacrificial material (e.g., polysilicon), depositing spacers on the sidewalls of the unfilled part of the hole, e.g., tetraethylorthosilicate-oxide (TEOS-oxide), to narrow the opening, removing through the narrowed opening the remaining part of the sacrificial material (e.g., by isotropic etching), and finally sealing the opening of the airgap by depositing a conform layer (TEOS-oxide) above the spacers. In case of a complete filling of the patterned hole, the material is etched back partly to yield a partly filled hole.

The method for forming an airgap trench is applied in deep trench isolation in BiCMOS applications. In such applications, an advantage of the methods of preferred embodiments is that a further reduction of the parasitic collector substrate perimeter capacitance can be achieved by introducing an airgap in the trench. The airgap trench thus makes it possible to reduce the width of the deep trench, thereby reducing the total device area while keeping the collector substrate capacitance unchanged.

Accordingly, in a first aspect, a method for forming an airgap in a substrate is provided, the method comprising the steps of: patterning a hole having sidewalls in the substrate; forming a partially filled-in portion of the hole, wherein the partially filled-in portion comprises a sacrificial material, whereby a portion of the sidewalls is exposed and a portion of the sidewalls is covered by the sacrificial material; depositing spacers on the exposed portion of the sidewalls, whereby an opening to the hole is narrowed; removing the sacrificial material through the narrowed opening; and sealing the opening by depositing a layer above the spacers, whereby an airgap is formed.

In an embodiment of the first aspect, the step of forming the partially filled-in portion of the hole comprises the steps of: completely filling the hole with a sacrificial material; and etching back a portion of the sacrificial material, whereby a portion of the sidewalls is exposed and a portion of the sidewalls is covered by the sacrificial material.

In an embodiment of the first aspect, the method further comprises the step of planarizing the layer above the spacers by removing a part of the layer above the spacers. The step of planarizing can comprise chemical mechanical planarizing.

In an embodiment of the first aspect, the sacrificial material comprises polysilicon.

In an embodiment of the first aspect, the spacers comprise tetraethylorthosilicate.

In an embodiment of the first aspect, the step of removing the sacrificial material through the narrowed opening comprises removing the sacrificial material through the narrowed opening by an isotropic etching process.

In an embodiment of the first aspect, the step of sealing the opening by depositing a layer above the spacers comprises depositing a layer by chemical vapor deposition. The layer above the spacers can comprise tetraethylorthosilicate.

In a second aspect, a bipolar complementary metal oxide semiconductor device, the device comprising: a substrate having a trench therein, the trench having walls and a bottom; an airgap enclosed in the trench in the substrate, the airgap having a top, a bottom, and sides; and a first field area and a second field area, wherein the airgap is situated between the first field area and the second field area.

In an embodiment of the second aspect, the top of the airgap is enclosed by a portion of spacers and a portion of a layer above the spacers, the portion of the spacers and the portion of the layer above the spacers sealing the opening of the trench;

In an embodiment of the second aspect, an oxide separating layer is atop the walls and the bottom of the trench, and in another embodiment of the second aspect, an extra oxide liner is atop the oxide separating layer. At least one of the oxide separating layer and the extra oxide layer can comprise tetraethylorthosilicate.

In an embodiment of the second aspect, the trench is tapered such that a width of the trench decreases deeper into the substrate.

In an embodiment of the second aspect, the substrate comprises silicon.

In an embodiment of the second aspect, the layer above the spacers comprises tetraethylorthosilicate.

In an embodiment of the second aspect, the spacers comprise tetraethylorthosilicate.

In an embodiment of the second aspect, the first field area comprises a planarized first field area and wherein the second field area comprises a planarized second field area.

In an embodiment of the second aspect, the first field area and the second field area each comprise an oxide.

BRIEF DESCRIPTION OF THE DRAWINGS

All drawings are intended to illustrate some aspects and embodiments. Devices are depicted in a simplified way for reason of clarity. Not all alternatives and options are shown and therefore the preferred embodiments are not limited to the content of the given drawings. Like numerals are employed to reference like parts in the different figures.

FIGS. 1A to 1H illustrate the different processing steps for forming an airgap using the method of a preferred embodiment.

FIGS. 2A to 2K illustrate the different processing steps for the integration of the deep airgap trenches for BiCMOS applications.

DETAILED DESCRIPTION OF THE PREFERRED EMBODIMENTS

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The term "sacrificial," as used herein, is a broad term and is used in its ordinary sense, including, without limitation, a material or a layer that is deposited temporarily, and that is not supposed to remain, at least totally, in the final device, or a material or layer that is destined to be removed, at least partially, during the process of fabricating a device.

The term "spacer," as used herein, is a broad term and is used in its ordinary sense, including, without limitation, a material or layer that is deposited on a side wall of a trench, hole, via, or other structure that is partially filled with a sacrificial material, in order to narrow the opening to the structure. The step of forming spacers can include two substeps: deposition of a layer of a spacer material that closes or substantially narrows the opening, preferably by a conformal deposition process; and then etching back the layer of the spacer material, whereby the spacer is formed. The etching back step can be performed by any suitable etching process, preferably an anisotropic dry etch process.

Method for Forming a Deep Trench Airgap

A general method for forming the airgap is described hereafter. The method is schematically presented in FIGS. 1A to 1H. In the example depicted in the figures, the substrate 1 is a Si wafer. The substrate can be a bare silicon wafer or a silicon wafer with extra layers deposited on top of it, such as an epitaxial growth layer (e.g., as in BiCMOS applications). If the substrate 1 is to be protected, a "substrate protecting layer" 2 can be deposited. Subsequently this protecting layer 2 and the substrate are patterned. For trench isolation, a trench is patterned. The trench is etched in such a way that the width becomes smaller as one goes deeper into the substrate. Such a tapered trench provides for better filling with fewer or no voids. Any suitable trench depth can be employed, depending upon the size of the airgap desired.

Figure 1A:
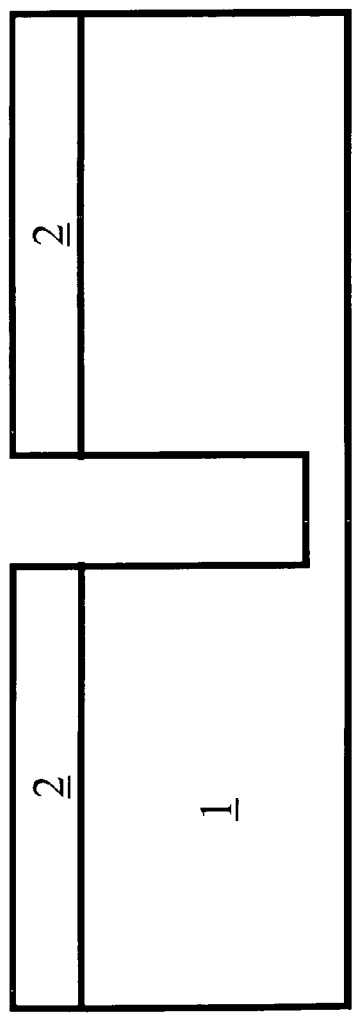
Figure 1B:
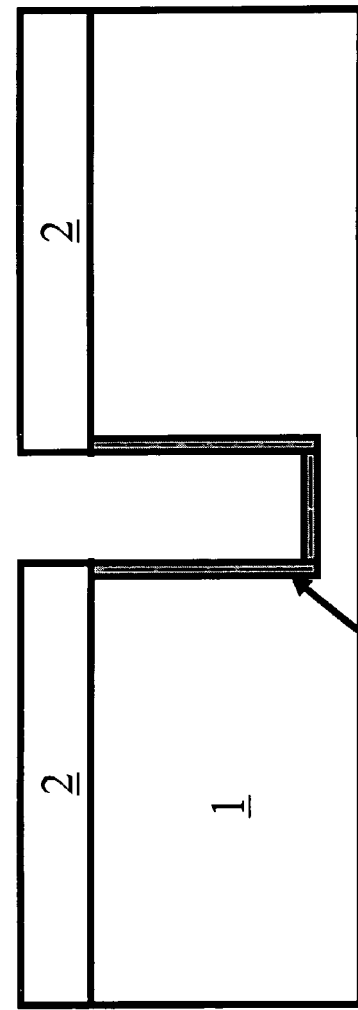
Figure 1C:
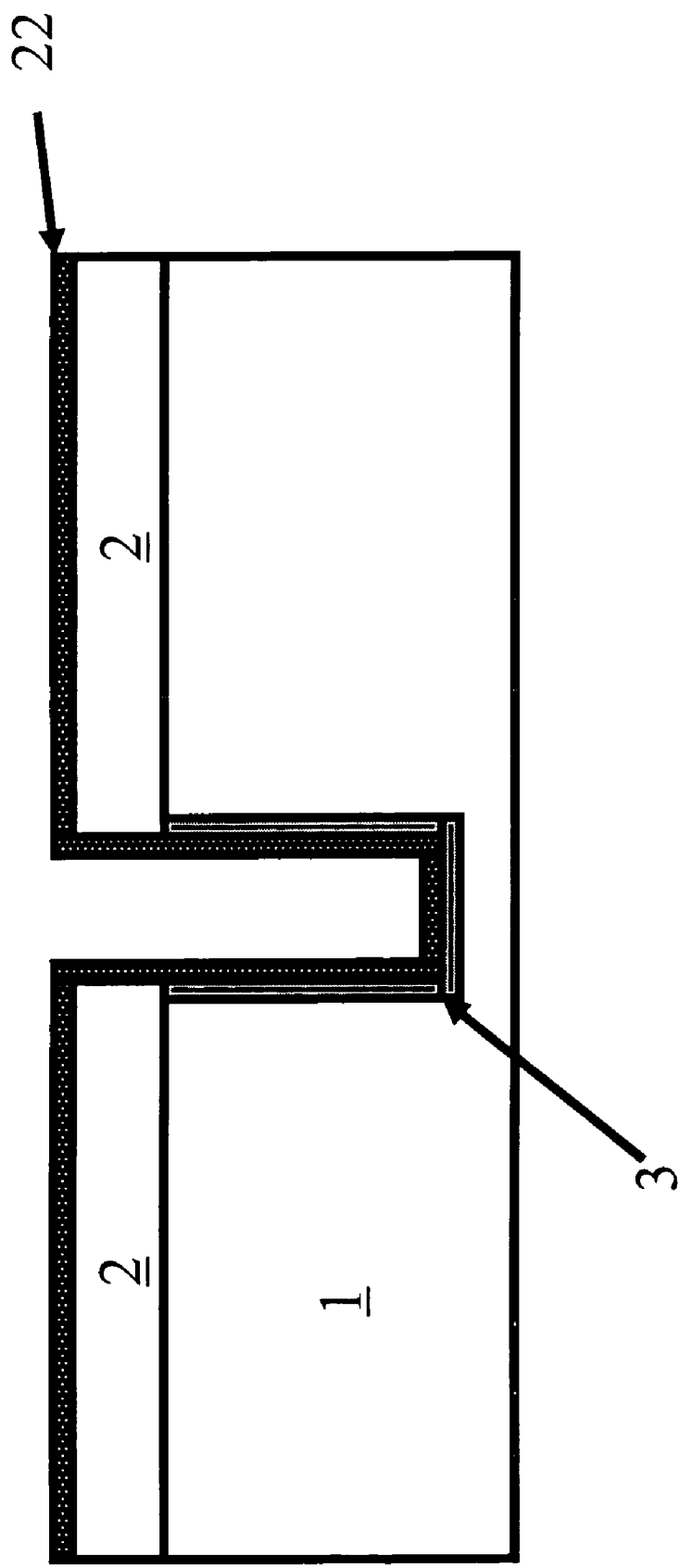

In the example shown in FIGS. 1A to 1H, the anisotropic patterning is done by dry etch (e.g., a reactive plasma based etch). As shown in FIGS. 1B and 1C, a separating layer is formed in the trench. This layer is can be employed when it is difficult to remove the sacrificial material 4 selectively towards the substrate 1. In the example depicted in the figures, first a 20 nm oxide layer as a separating layer is grown on the Si trench surface (depicted in FIG. 1B) by a thermal or wet oxidation process. Additionally, an extra oxide liner 22 can be deposited that is of variable thicknesses (up to and including about 300 nm in thickness) as shown in FIG. 1C. This deposited liner can further act as additional protective layer during patterning or during wet removal. In the example depicted in the figures, the deposited oxide liner is TEOS-oxide. However, any other suitable dielectric material can be alternatively be employed.

Subsequently, the sacrificial material 4 is deposited to fill the trench (see FIG. 1D). Any suitable sacrificial material can be employed. While polysilicon is generally preferred, other materials, for example, amorphous silicon, or an oxide (removed by a wet etch). In the example depicted in the figures, 1200 nm of polysilicon is deposited. Chemical Mechanical Polishing (CMP) is used to planarize this material with the deposited liner 22 acting as a stopping layer. However, other techniques such as dry etch or wet etch can be suitably employed as well. The sacrificial material 4 in the trench is removed (e.g., by means of an etchback) until a level below the top of the protecting layer 2 is achieved such that a partly filled trench is created (see FIG. 1E).

Figure 1F:
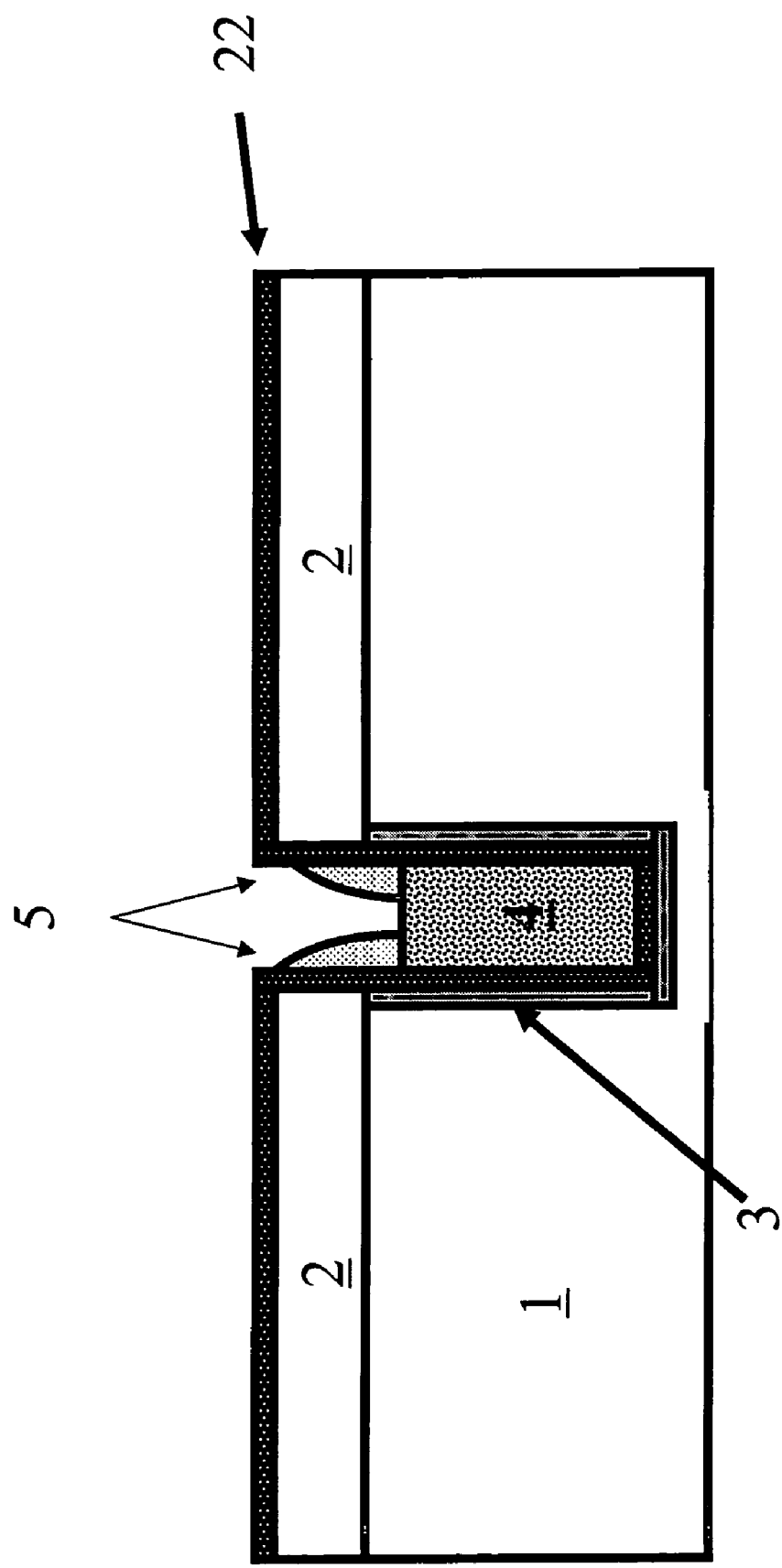
Figure 3:
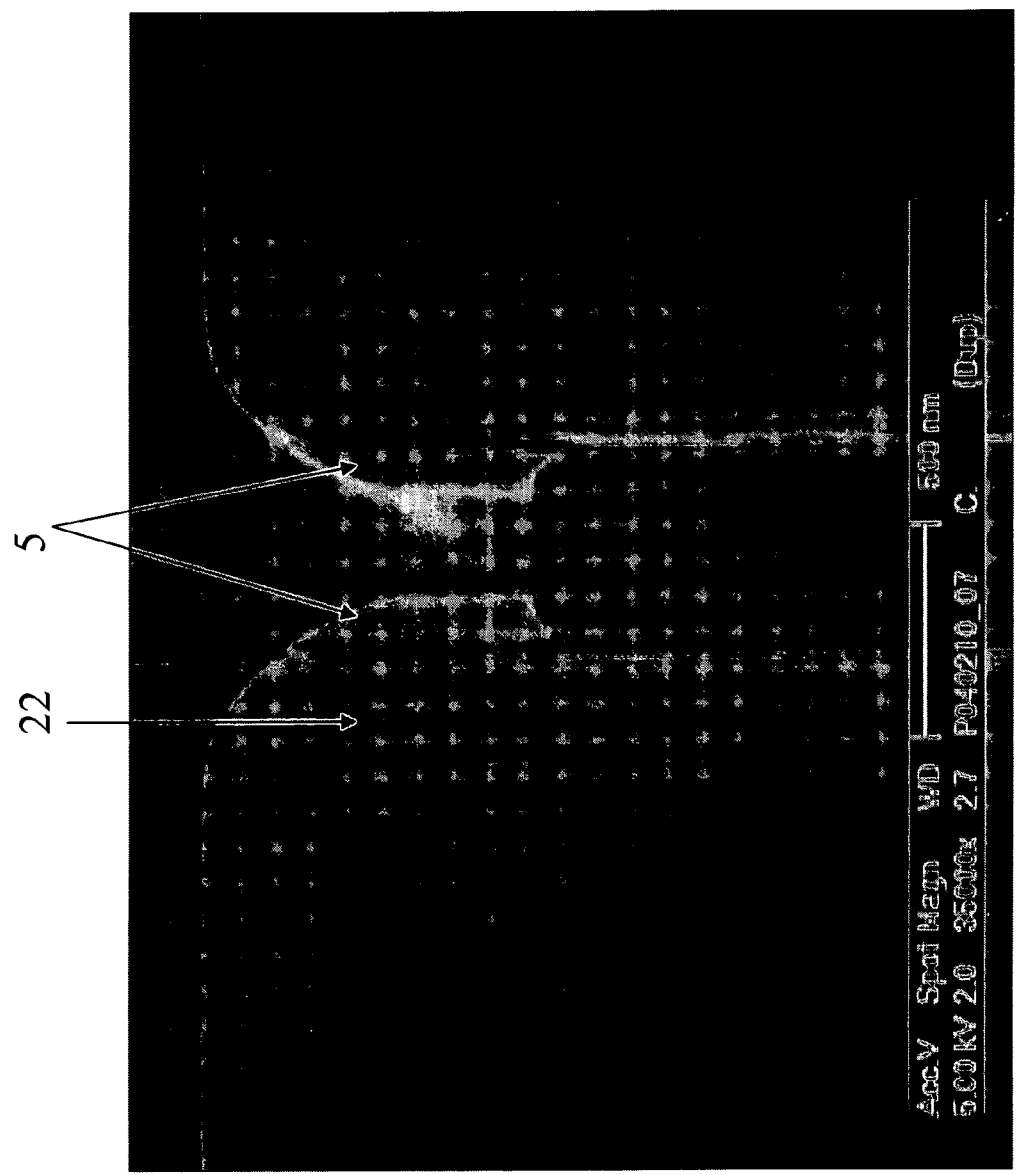
FIG. 3 shows a SEM picture illustrating the formation of spacers to narrow the opening of the partly filled hole.

In FIG. 1F, spacers 5 are formed to narrow the opening of the trench. The spacers are formed by a deposition process (e.g., a conformal deposition process) followed by an etchback process (e.g., an anisotropic etchback process). In the example depicted in the figures, an oxide spacer is formed, more specifically, TEOS-oxide spacers are formed. For ease of dry etch endpoint triggering, a 10 nm nitride liner can be deposited first. The nitride layer can facilitate end point detection. In the example depicted in the figures, the distance between the spacers after spacer formation is from about 50 to about 200 nm. FIG. 3 shows a SEM picture illustrating the formation of spacers to narrow the opening of the partly filled hole. The spacers 5 are indicated, as well as the oxide liner 22.

Figure 1G:
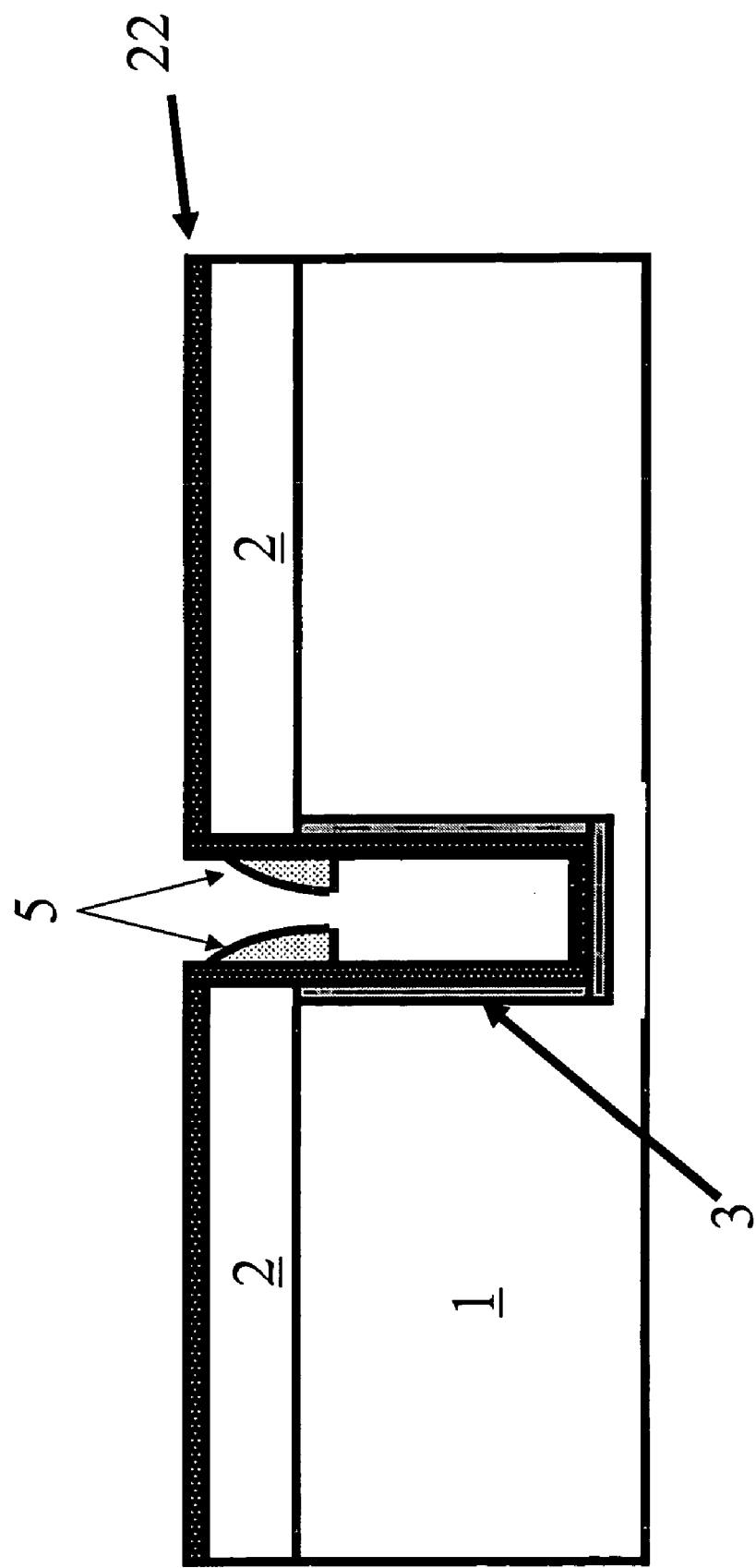

After spacer etching, the sacrificial material is removed through the opening formed between the spacers (see FIG. 1G). In the example depicted in the figures, the sacrificial material is polysilicon and is removed by, e.g. a $SF_6$ based isotropic dry etch plasma. Other reactive gases can also be employed. Likewise, techniques such as down stream etching can be suitably employed as well. The sacrificial material is converted into a gas that can leave through the opening between the spacers. If oxide is used as a protective layer, the etching is selective towards oxide.

Figure 1H:
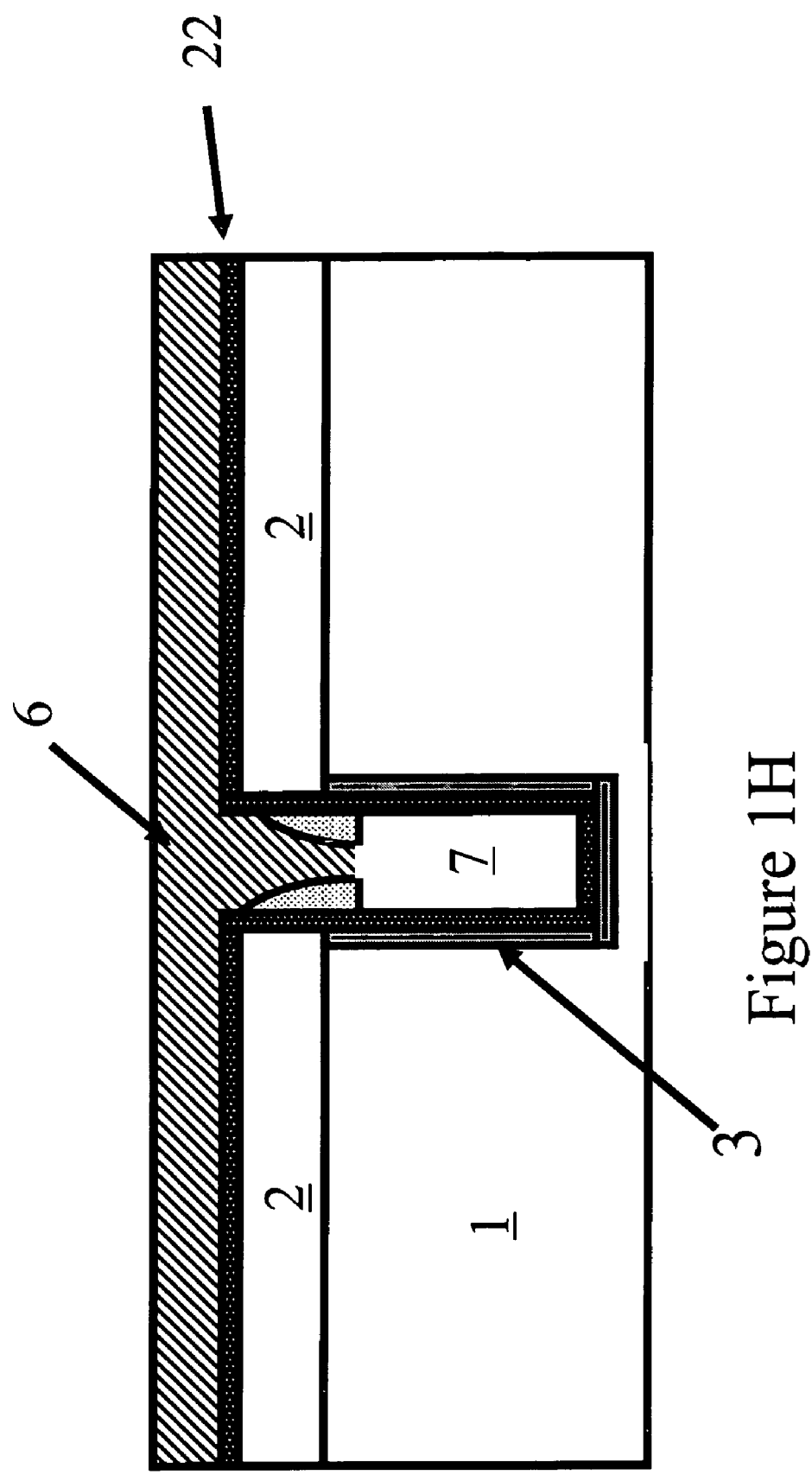
Figure 4:
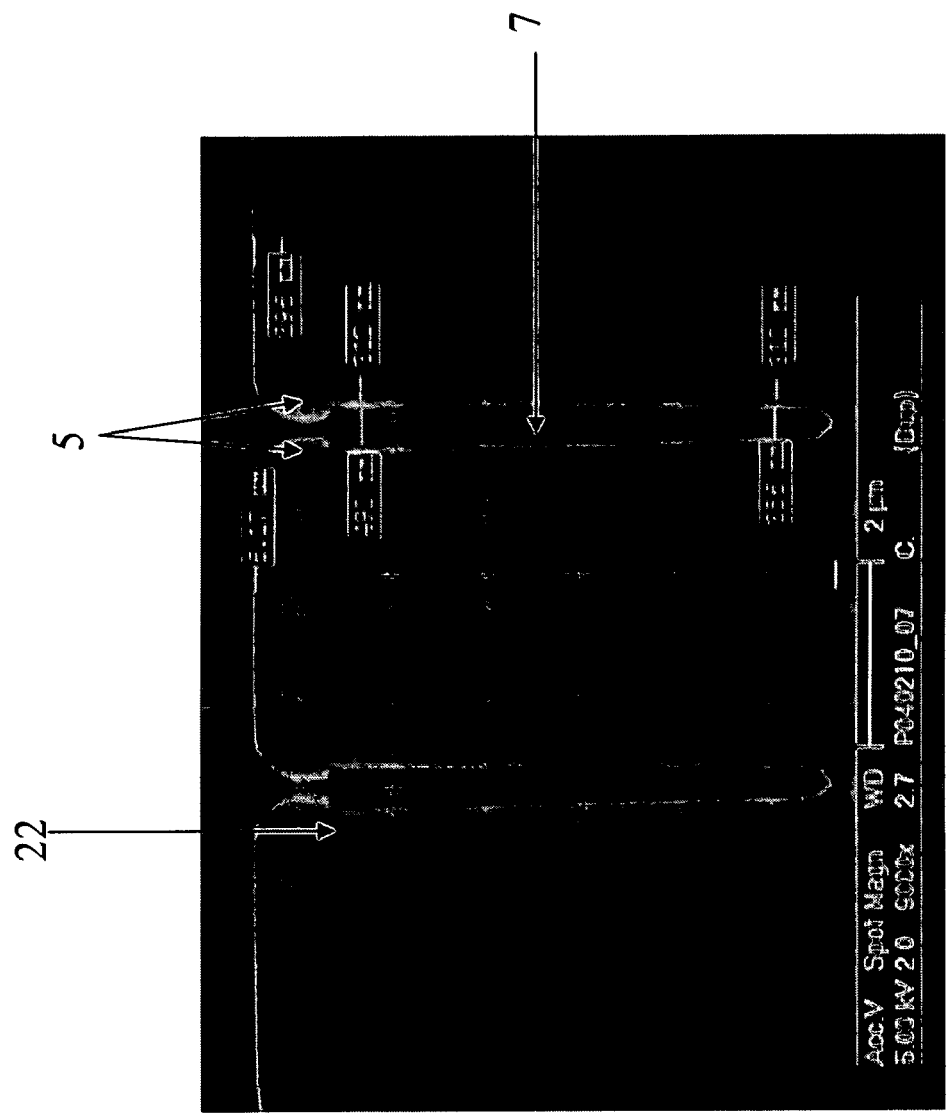
FIG. 4 shows a SEM picture illustrating the formation of the deep airgap trench after spacer formation and removal of the sacrificial material (polysilicon) by isotropic etching.
Figure 5:
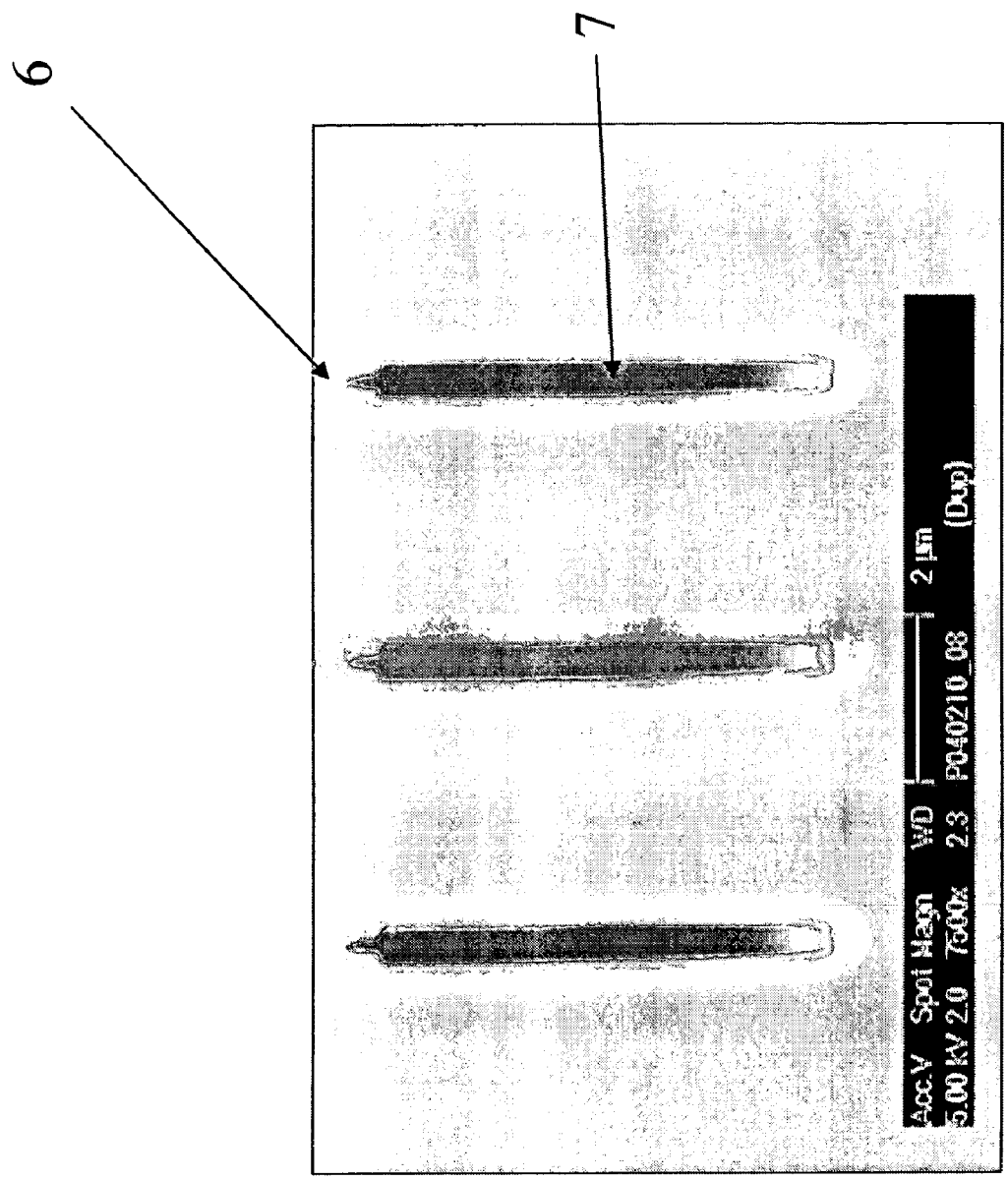
FIG. 5 shows a SEM picture illustrating the formation of the deep airgap trench 16 after removal of the sacrificial material (polysilicon) by isotropic etching and deposition of a conformal layer 6 (e.g., TEOS-oxide deposition by Chemical Vapor deposition) to close the airgap.
Figure 6:
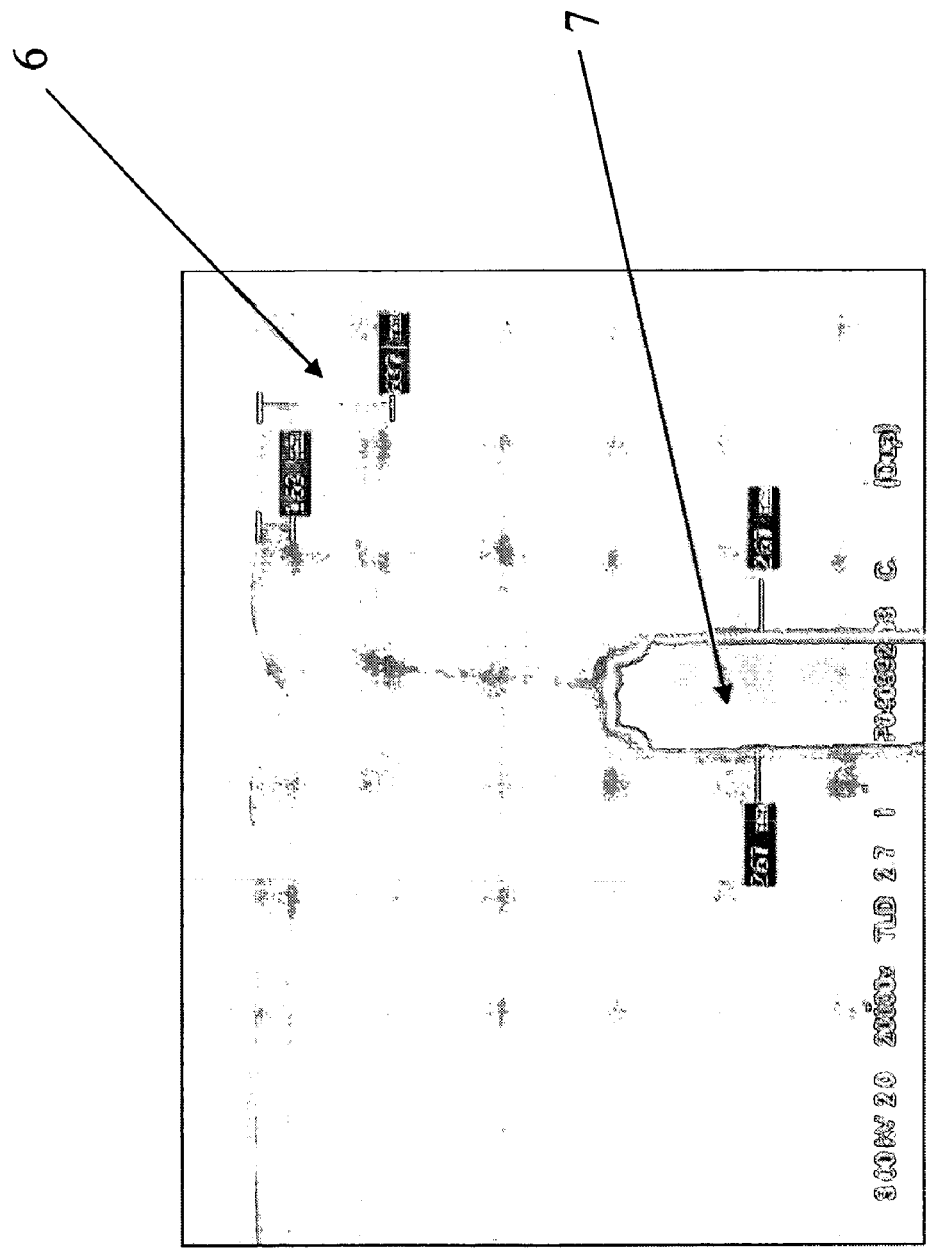
FIG. 6 shows a more detailed SEM picture illustrating the deposited conformal TEOS layer 6 (by Chemical Vapor deposition) to close the airgap.

FIG. 4 shows a SEM picture illustrating the formation of the deep airgap trench 7 after removal of the sacrificial material (polysilicon) through the narrowed opening by isotropic etching. The spacers 5 are indicated, as well as the oxide liner 22. Finally, the opening between the spacers is sealed via a deposition process. In the example depicted in the figures, a conformal oxide deposition process is employed to form the sealing layer 6 (e.g., a TEOS layer formed by Chemical Vapor Deposition). FIG. 1H shows the airgap 7 formed after sealing the opening. As a side effect, a small amount of TEOS is deposited inside the trench. The deposited sealing layer 6 can be further planarized (e.g., by chemical mechanical planarization), stopping at the protecting layer 2. Accordingly, an airgap is created that is situated completely in the substrate. While the above-described procedure is generally preferred for sealing the airgap, other deposition processes can also be suitable for use. Likewise, a non-conformal deposition process can alternatively be employed. FIGS. 5 and 6 show SEM pictures illustrating the airgap trench 7 after removal of the sacrificial material (polysilicon) by isotropic etching and deposition of a conformal layer 6 (e.g., a TEOS layer deposited by Chemical Vapor deposition) to close the airgap.

In an alternative method, the process begins by depositing at least one protecting layer onto the substrate 1. More preferably, a combination of two, three, or more protecting layers is deposited onto the substrate 1. As an example the protecting layers can comprise a first oxide layer (e.g. 300 nm thickness), on top of a second nitride layer (e.g. 115 nm thickness), on top of a third oxide layer (e.g. 10 nm thickness), on top of the substrate. In a preferred embodiment, the first oxide protecting layer, if present, is less than or equal to about 5 microns in thickness, more preferably it is from about 100 to about 500 microns in thickness. The second nitride layer, if present, is preferably from about 150 to about 300 nm in thickness. The third oxide layer, if present, is preferably of a thickness of less than or equal to about 25 nm. Subsequently, the protecting layers and the substrate are patterned.

In another alternative method, the deposition of the sacrificial material 4 is such that a partly filled trench is created and no further etchback is conducted.

BiCMOS Devices with Airgaps

The methods of the preferred embodiments for forming airgaps can be successfully applied to the formation of deep trench airgaps for an active area—field isolation module in a BiCMOS device. BiCMOS deep trenches have a typical trench depth of from about 500 nm to about 15 microns, preferably about 6 microns, and a critical dimension (CD) of about 200 nm to about 2 microns, preferably about 1 micron. Such ranges can also be suitable for trenches employed in high voltage applications. For wafer dicing, a depth of up to about 50 microns or more and a critical dimension of up to about 10 microns or more is generally preferred. For vias, a depth of from about 10 microns to about 100 microns and a critical dimension of from about 500 nm to about 5 microns are generally preferred.

The different processing steps for the integration of the deep airgap trenches for BiCMOS applications are illustrated in FIGS. 2A to 2K. First, a combination of protecting layers is deposited on top of the Si substrate 1. As an example, first an oxide layer 11 (e.g., with thickness of up to about 25 nm, preferably about 10 nm) can be deposited, followed by a nitride layer 12 of about 115 nm thickness (see FIG. 2A). The oxide layer 11 minimizes strain effects from the nitride layer 12 into the substrate. The nitride layer 12 serves as an active protecting layer or stop layer (e.g., Active Protecting Nitride or APN) during CMP steps. If older technologies other than CMP are employed, it can be desirable to employ a thicker nitride layer, e.g., a nitride layer having a thickness of from about 150 nm up to about 300 nm.

Figure 2C:
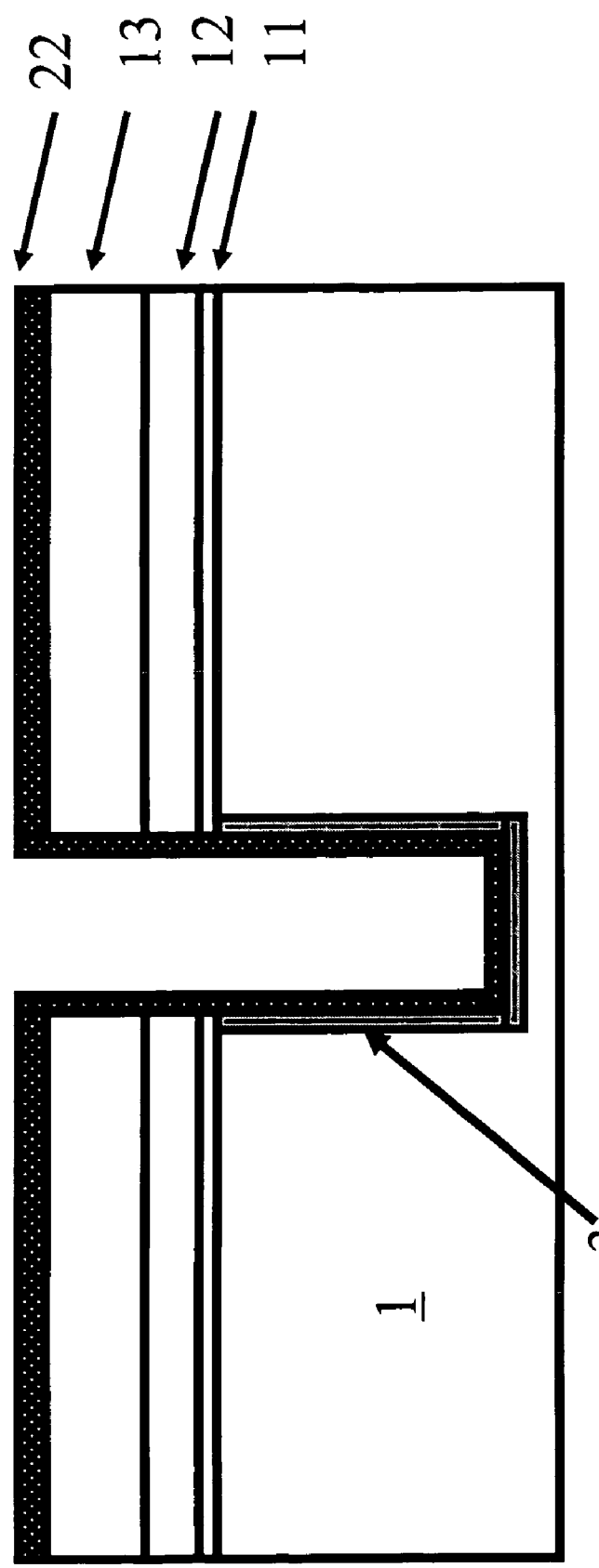

On top of the APN, an oxide layer 13 (up to about 300 nm in thickness) is deposited. This oxide layer 13 serves as a hard mask for subsequent trench etching. Preferably, a hard mask having a thickness of about 4 microns is employed. Such a thickness is suitable for etching trenches having a depth up to or including about 100 microns. Alternatively, a resist hard mask layer can be employed instead of oxide layer 13. Subsequently, the protecting layers and the substrate are patterned. As shown in FIGS. 2B and 2C, a separating layer 3 is then formed within the patterned structure. This layer is employed when it is difficult to remove the sacrificial material 4 selectively towards the substrate 1. In the example depicted in the figures, first a 20 nm oxide 3 as a separating layer is grown on the Si trench surface (FIG. 1B) by a thermal or wet oxidation process.

Additionally, an extra oxide liner 22 can be deposited of variable thicknesses (up to and including about 300 nm in thickness). The thickness is selected based on the application, the width of the feature (e.g., trench, via, hole) in which the airgap is to be created. For bigger trenches or in specific applications, more space is left for a thicker liner. Generally, a thickness of up to about 300 nm or more is generally preferred. In this particular case, the oxide liner is TEOS-oxide. Subsequently, the sacrificial material 4 is deposited to fill the trench. In the example depicted in the figures, 1200 nm of polysilicon is deposited. Chemical Mechanical Polishing (CMP) is used to planarize this material with the protecting layer as a stopping layer. However, other techniques, such as dry etch or wet etch techniques, can be suitably employed as well.

Figure 2D:
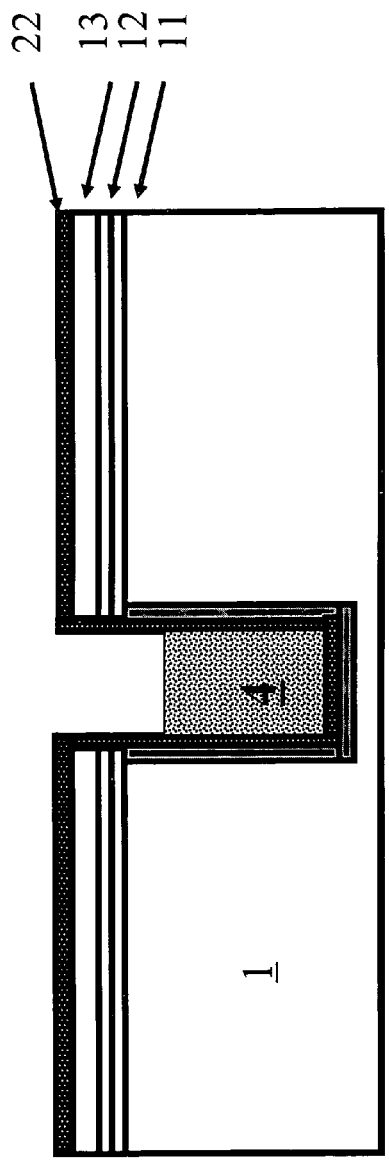
Figure 2E:
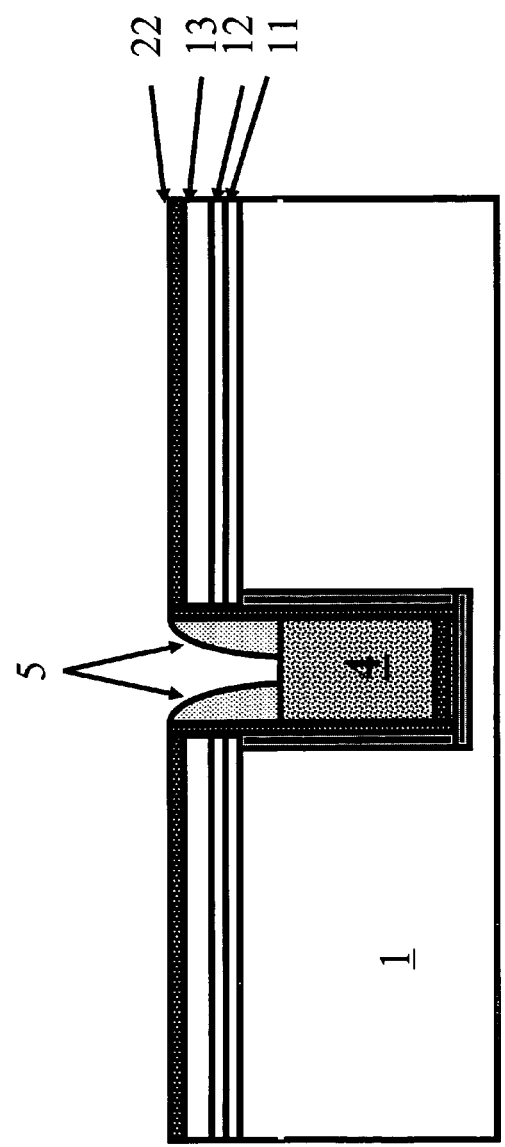

The sacrificial material 4 within the trench is removed (e.g., by etchback) to a level below the top of the protecting layer, such that a partly filled trench is created (see FIG. 2D). In FIG. 2E, spacers 5 are formed to narrow the opening of the trench. The spacers are formed by a deposition process followed by an anisotropic dry etch. In the example depicted in the figures, an oxide spacer is formed, namely, TEOS-oxide spacers are formed. For dry etch endpoint triggering, approximately 10 nm of nitride liner is deposited first. After spacer formation, the distance between the spacers is from about 50 to about 200 nm. After spacer etching, the sacrificial material is removed through the opening formed between the spacers (see FIG. 2F). In the example depicted in the figures, the sacrificial material is polysilicon and is removed by dry-etching (e.g. by an $SF_6$ based isotropic dry etch plasma). Other reactive gas techniques, such as downstream etching and wet etching, can also be employed. The sacrificial material is converted into a gas that can leaves through the opening between the spacers 5.

The etching is preferably selective towards the liner and spacer materials used (e.g., TEOS oxide). Finally, the opening between the spacers is sealed by a deposition process. In the example depicted in the figures a conformal oxide deposition 6 is used (e.g., TEOS by Chemical Vapor Deposition). The processing continues with planarization of the sealing layer 6 by CMP stopping on the APN 12 (FIG. 2H). Subsequently, the field area is patterned. The field area is patterned by putting a lithographic photo (approximately 248-193 nm in width) over the area, followed by dry etching the layers 11 and 12 and the substrate 1 (see FIG. 2I). Any suitable patterning method(s) and/or patterning material(s) can be employed as are compatible with the other components of the device. Typically, the etch depth in the substrate is from about 300 to about 400 nm.

Figure 2J:
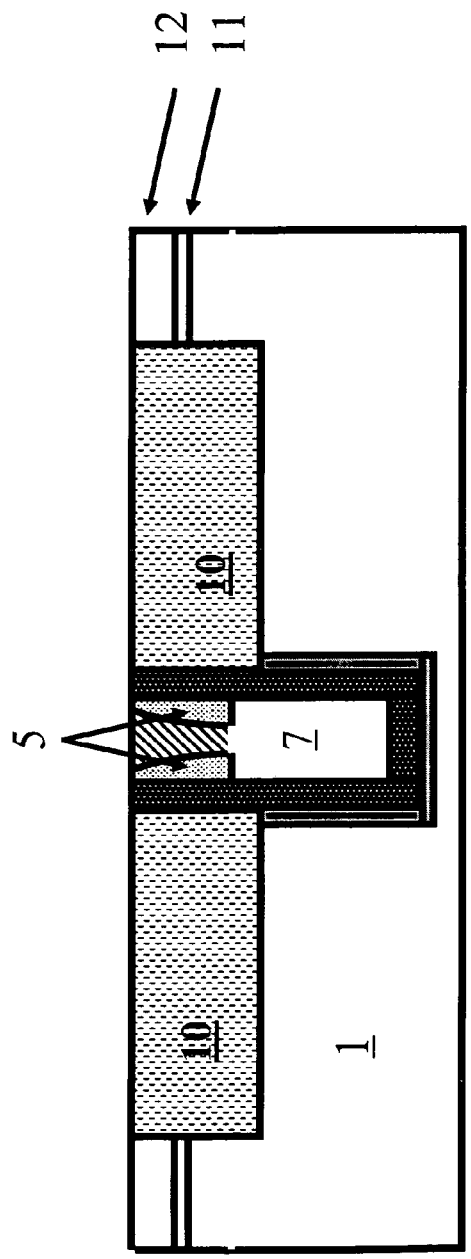
Figure 2K:
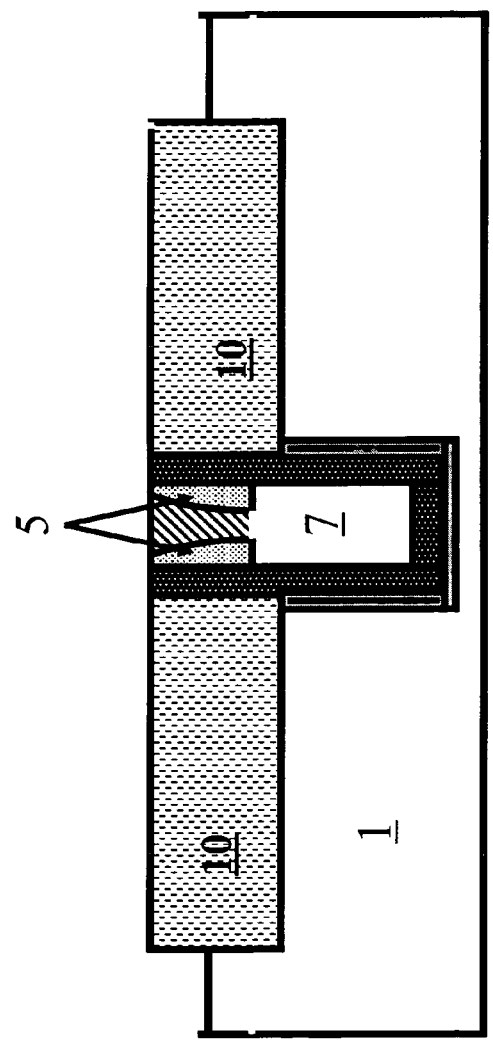

Layers 11 and 12 can be dry etched with fluor based chemistry (e.g., $CF_4$, $C_2F_6$, $CHF_3$, $CH_2F_2$, $SF_6$, or the like). In the example depicted in the figures, the substrate dry etch is based upon a $Cl_2/HBr/O_2/He/N_2$ chemistry and has good selectivity towards oxide. In order to have good filling, the etch in the substrate has a slope. Filling the field areas with a field oxide 10 and planarization of this oxide is the next step (FIG. 2J). Finally, the APN 12 and the oxide layer 11 are removed from the active area.

Figure 7:
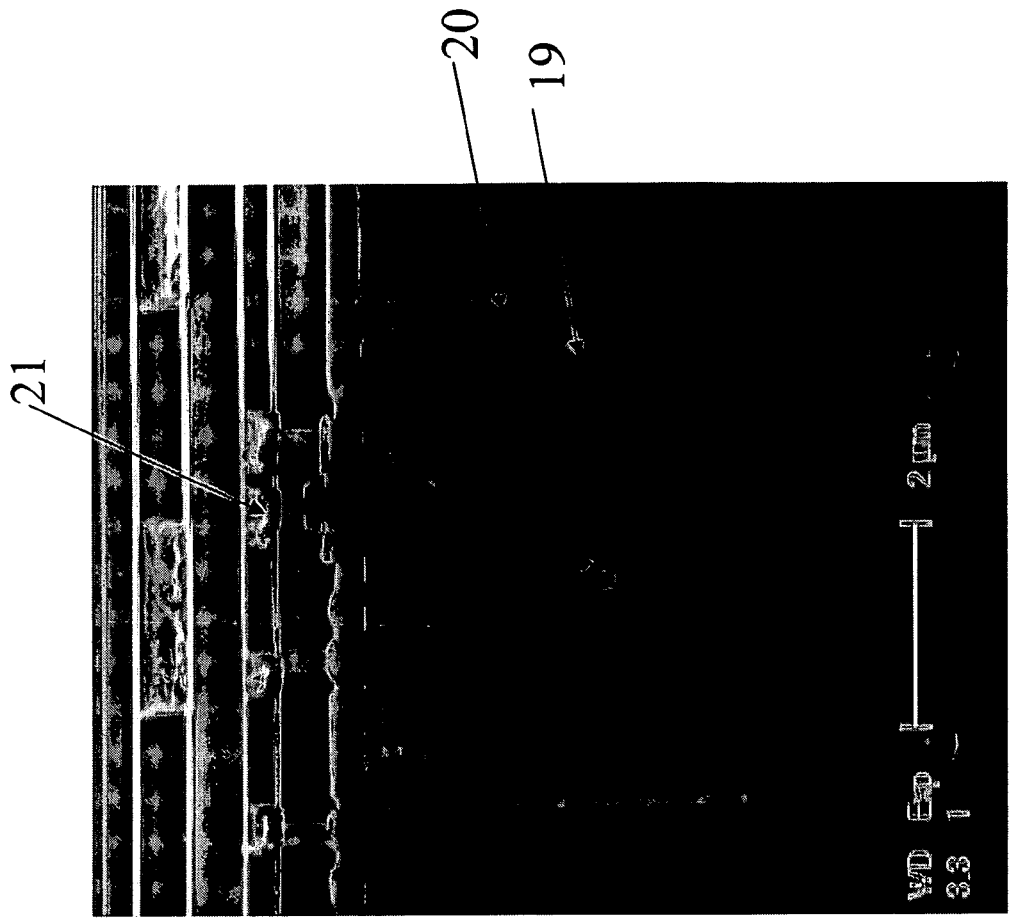
FIG. 7 illustrates a SEM picture showing a classical prior art deep isolation trench in the substrate 18 filled with a combination of TEOS-oxide 20 and polysilicon 19 in a BiCMOS device. The bipolar transistors 21 are also indicated.

FIG. 7 provides an SEM micrograph depicting a prior art BiCMOS device with a classical deep isolation trench in the substrate 18 filled with a combination of TEOS-oxide 20 and polysilicon 19 in a BiCMOS device.

Figure 8:
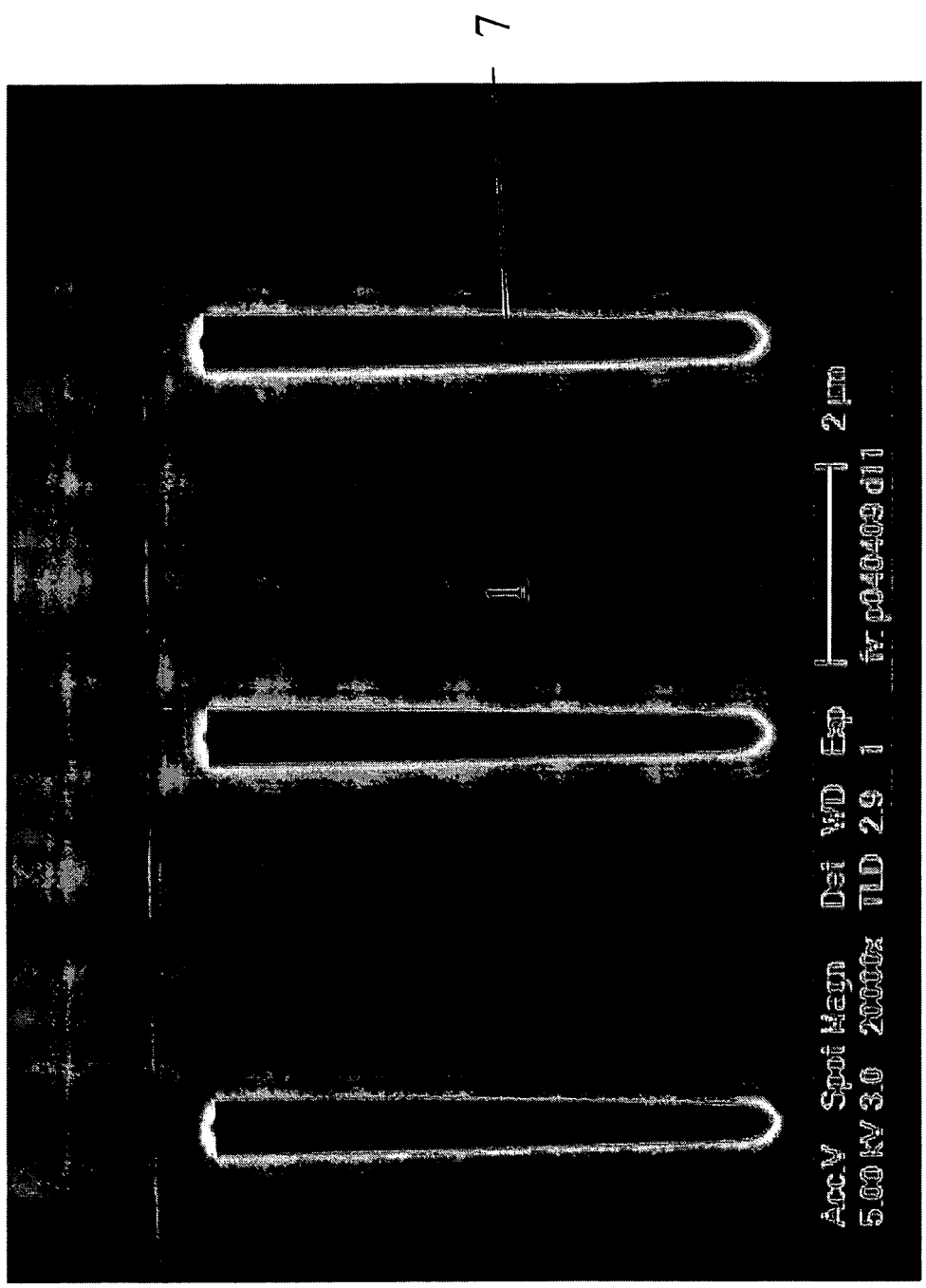
FIG. 8 illustrates a SEM picture showing the deep isolation trench of a preferred embodiment integrated in a BiCMOS device.

FIG. 8 provides an SEM picture showing a deep isolation airgap trench 7 of a preferred embodiment integrated in the same BiCMOS device as depicted in FIG. 7.

Extension Towards High-Voltage Technology and Mixed Signal/RF Technology

Deep trench airgaps can be used in high-voltage technology, wherein the airgap deep trench can be used for isolation of the high-voltage devices, including NPN, PNP and vertical DMOS, from the substrate. The airgap deep trench has higher breakdown voltage and lower capacitance towards the substrate. Alternatively, the trench width can be reduced for the same breakdown and capacitance, hence saving chip area.

Deep trench airgaps can be used in high-voltage technology wherein the airgap is used for device termination, such as in integrated super-junction devices. These devices are prone to breakdown at the perimeter, when the device is not properly terminated. In this case, the deep trench has to reach the buried layer n-type. The advantage of the airgap deep trench is similarly higher breakdown voltage, or, alternatively, a smaller deep trench for same breakdown voltage.

Extension Towards High-Voltage Technology and Mixed Signal/RF Technology

Deep trench airgaps can be used in Mixed Signal and RF technology for suppression of substrate cross-talk. The switching noise of the digital circuitry on these chips degrades the spectral purity of the sensitive analog and RF blocks. Airgap deep trench isolation can be used to isolate these regions better, since it is an isolation method with low capacitance towards the substrate. Placing a network of airgap deep trench isolations under on-chip inductors, transformers, and transmission line improves the RF performance of these components through the reduction of eddy currents in the substrate and by decreasing the capacitive coupling of these components towards the substrate.

Other Applications for Deep Airgap Trenches/Vias

The methods of the preferred embodiments for making deep airgap trenches can be applied to several other applications within semiconductor processing.

Aside from trenches, the methods of preferred embodiments are also useful for forming airgap vias or other types of structures.

The deep trench airgaps of preferred embodiments can be formed at any level within the semiconductor circuit, taking thermal budget in consideration, which suggests replacement of some materials by lower temperature deposition materials. After sealing the airgap, normal FEOL and/or BEOL processing can be performed, depending upon the application. All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for forming a bipolar complementary metal oxide semiconductor device, the method comprising the steps of:
    patterning a trench having sidewalls in the substrate;
    depositing an oxide separating layer atop the sidewalls and bottom of the trench;
    depositing an extra oxide liner atop the oxide separating layer;
    forming a partially filled-in portion of the trench, wherein the partially filled-in portion comprises a sacrificial material, whereby a portion of the sidewalls is exposed and a portion of the sidewalls is covered by the sacrificial material;
    depositing spacers on the exposed portion of the sidewalls atop the extra oxide liner, whereby the spacers extend towards the filling material, whereby an opening to the trench is narrowed;
    removing the sacrificial material though the narrowed opening;
    sealing the opening by depositing a layer above the spacers, whereby an airgap is formed; and thereafter
    forming a first field area and a second field area inside the substrate a bipolar transistor in the substrate, wherein the airgap is situated between the first field area and the second field area and comprises part of an active area field isolation module in a bipolar complementary metal oxide semiconductor device thus obtained.

2. The method of claim 1, wherein the step of forming the partially filled-in portion of the trench comprises the steps of:
    completely filling the trench with a sacrificial material; and
    etching back a portion of the sacrificial material, whereby a portion of the sidewalls is exposed and a portion of the sidewalls is covered by the sacrificial material.

3. The method of claim 1, further comprising the step of:
    planarizing the layer above the spacers by removing a part of the layer.

4. The method of claim 1, wherein the sacrificial material comprises polysilicon.

5. The method of claim 1, wherein the spacers comprise tetraethylorthosilicate.

6. The method of claim 1, wherein the step of sealing the opening by depositing a layer above the spacers comprises depositing a layer by chemical vapor deposition.

7. The method of claim 6, wherein the layer above the spacers comprises tetraethylorthosilicate.

8. The method of claim 3, wherein the step of planarizing comprises chemical mechanical planarizing.

9. The method of claim 1, wherein the step of depositing spacers on the exposed portion of the sidewalls comprises a deposition process followed by an etchback process.

10. The method of claim 1, wherein the deposition process is a conformal deposition process.

11. The method of claim 9, wherein the etchback process is an anisotropic etchback process.

12. A method for forming a bipolar complementary metal oxide semiconductor device, the method comprising the steps of:
    patterning a trench having sidewalls in the substrate;
    depositing an oxide separating layer atop the sidewalls and bottom of the trench;
    depositing a nitride liner atop the oxide separating layer;
    forming a partially filled-in portion of the trench, wherein the partially filled-in portion comprises a sacrificial material, whereby a portion of the sidewalls is exposed and a portion of the sidewalls is covered by the sacrificial material;
    depositing spacers on the exposed portion of the sidewalls atop the extra oxide liner, whereby the spacers extend towards the filling material, whereby an opening to the trench is narrowed;
    removing the sacrificial material through the narrowed opening;
    sealing the opening by depositing a layer above the spacers, whereby an airgap is formed; and thereafter
    forming a first field area and a second field area inside the substrate a bipolar transistor in the substrate, wherein the airgap is situated between the first field area and the second field area and comprises part of an active area field isolation module in a bipolar complementary metal oxide semiconductor device thus obtained.

13. The method of claim 1, wherein a depth of the trench is from about 500 nm to about 15 microns, and wherein the trench has a critical dimension of from about 200 nm to about 2 microns.

14. The method of claim 1, wherein a depth of the trench is up to about 50 microns, and wherein the trench has a critical dimension up to about 10 microns.

15. The method of claim 1, wherein a depth of the trench is from about 10 microns to about 100 microns, and wherein the trench has a critical dimension of from about 500 nm to about 5 microns.

16. The method of claim 1, wherein the step of patterning a trench having sidewalls in the substrate comprises patterning a trench having a width of from about 200 nm to about 2 microns.

17. The method of claim 16, wherein a distance between the spacers after spacer formation is from about 50 nm to about 200 nm.

18. The method of claim 1, wherein the step of patterning a trench having sidewalls in the substrate comprises patterning a trench having a width of up to about 10 microns.

19. The method of claim 18, wherein a distance between the spacers after spacer formation is from about 50 nm to about 200 nm.

20. The method of claim 1, wherein the step of patterning a trench having sidewalls in the substrate comprises patterning a trench having a width of from about 500 nm to about 5 microns.

21. The method of claim 20, wherein a distance between the spacers after spacer formation is from about 50 nm to about 200 nm.

22. The method of claim 1, wherein the step of forming a first field area and a second field area inside the substrate comprises:
    patterning a first field area and a second field area;
    filling the first field area and the second field area with a field oxide; and
    planarizing the field oxide.

23. The method of claim 22, wherein the step of forming a first field area and a second field area inside the substrate further comprises removing the oxide separating layer and the extra oxide liner from the active area.

24. The method of claim 1, wherein the step of removing the sacrificial material though the narrowed opening comprises dry anisotropic etching.

25. The method of claim 12, wherein the step of forming a first field area and a second field area inside the substrate comprises:
    patterning a first field area and a second field area;
    filling the first field area and the second field area with a field oxide; and
    planarizing the field oxide.

26. The method of claim 13, wherein the step of forming a first field area and a second field area inside the substrate further comprises removing the oxide separating layer and the nitride liner from the active area.

27. The method of claim 12, wherein the step of removing the sacrificial material through the narrowed opening comprises dry anisotropic etching.

* * * * *

UNITED STATES PATENT AND TRADEMARK OFFICE
CERTIFICATE OF CORRECTION

PATENT NO. : 7,396,732 B2  Page 1 of 1
APPLICATION NO. : 11/048642
DATED : July 8, 2008
INVENTOR(S) : Eddy Kunnen It is certified that error appears in the above-identified patent and that said Letters Patent is hereby corrected as shown below:

| Issued Patent | | 1. | Description of Error |
|---|---|---|---|
| On the Title pg, Item (56) (Other Publications) | | | Delete "Self-Algined" and insert -- Self-Aligned --, therefor. |
| Col. | Line | | |
| 1 | 40 (Approx.) | | Delete "finctionality" and insert -- functionality --, therefor. |
| 3 | 58 | | Delete "trench;" and insert -- trench. --, therefor. |
| 9 | 55 | | In Claim 1, delete "though" and insert -- through --, therefor. |
| 12 | 4 | | In Claim 24, delete "though" and insert -- through --, therefor. |

Signed and Sealed this
Fifteenth Day of February, 2011

David J. Kappos
*Director of the United States Patent and Trademark Office*